INTEGRAL ETTINGSHAUSEN-PELTIER THERMOELECTRIC DEVICE

Filed Jan. 17, 1967

INVENTOR.
GEORGE G. HEARD JR.
BY
George G. Heard Jr.

United States Patent Office 3,547,705
Patented Dec. 15, 1970

3,547,705
INTEGRAL ETTINGSHAUSEN-PELTIER THERMOELECTRIC DEVICE

George Guy Heard, Jr., Huntsville, Ala.
(2012 Walker Ave., Greensboro, N.C. 27403)

Filed Jan. 17, 1967, Ser. No. 610,217
Int. Cl. H01v *1/28*
U.S. Cl. 136—203 1 Claim

ABSTRACT OF THE DISCLOSURE

An integral semiconductor Ettingshausen-thermoelectric device for use as a heat pump or electricity generator. The N-type and P-type semiconductor legs of the thermoelectric device are grown directly and autogenously on the base of the Ettingshausen unit.

Figure 1:
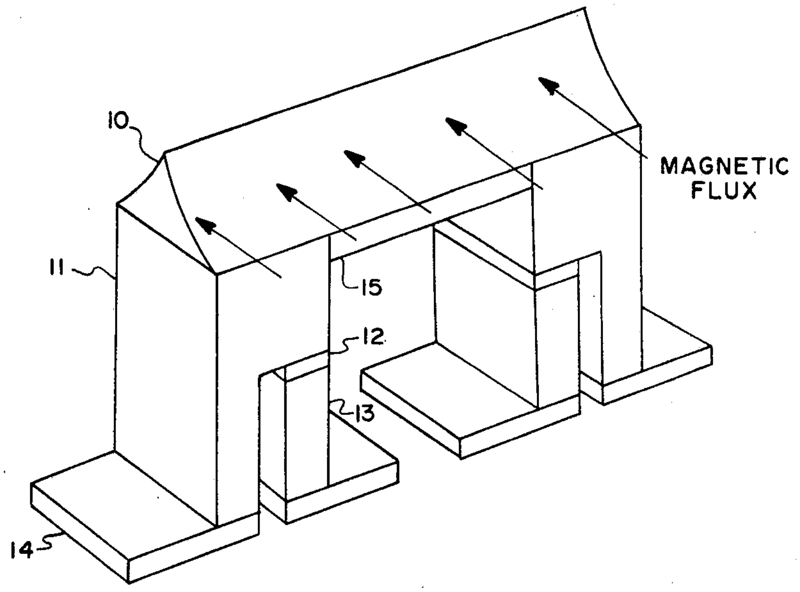

This invention relates to a system of providing inhanced efficiency in the field of thermoelectricity. More particularly, it refers to a system of improvements in the interrelationship of components, and the institution of new concepts in the relationship between components of the thermoelectric heat pump and generator.

The invention has particular application in the field of Peltier, Magneto-Peltier, and Ettingshausen thermoelectric heat pumps and generators; however, those skilled in the art will recognize applicability in other fields where it is desired to enhance the electrical conductivity characteristics of a system more significantly than the thermal conductivity.

Currently, thermoelectric heat pumps and generators are produced based upon the original concept of Peltier or Ettingshausen, and comprise uniformly doped semiconductor, or semi-metal materials formed in a manner to produce a suitably sized and shaped material for fabrication into the thermoelectric device by means of bonding or by clamping. When it is desired or required to stack thermoelectric equipment, the individual devices are constructed and bonded to each other, either utilizing a conducting bond to pass the electrical current through one device to reach the other, or the units are separated by a thermal conducting electrical insulating plate.

It is obvious that the present system and its implementation requires the basic thermoelectric material to operate at energy levels other than optimum in that there is a thermal gradient over the material. A choice of dopants and doping levels must be chosen as a compromise between the high and low temperatures rather than having the entire volume of thermoelectric material operate at optimum efficiency.

It is further obvious that the inclusion of bonding materials between units of stacked thermoelectric devices offers an undesired electrical resistance producing an energy loss, or where an electrically insulating plate is used an unwanted thermal drop is produced.

The principal techniques which have been proposed to reduce the heat generated within the thermoelectric device are to reduce thermal conductivity within the thermoelectric material, and increase thermal conductivity between stacked thermoelectric devices. Material evaluations have been conducted to choose optimum electrical and thermal characteristics. Other investigators have concentrated their efforts on the methods of obtaining good adhesion or wetting of the thermoelectric material by the bonding material. Other efforts have been made to determine the maximum number of thermoelectrical units which can be stacked before the loss of efficiency reaches a point that additional units within the stack will produce no additional cooling.

In yet another technique, and one according to the present invention, surprising improvements in efficiency are achieved by eliminating the energy loss in bonding materals and insulating plates, and allowing the entire volume of thermoelectric material to perform at optimum efficiency. This improvement in efficiency is accomplished by the elimination of bonded points in the stacked thermoelectric units, or using one portion of the thermoelectric junction interface to provide the environment for another part of the interface, and by doping the thermoelectric material for optimum efficiency by variations in the doping level as a function of the specific operating temperature of the material. For ease of understanding, the invention may be conveniently discussed in three parts, which may be applied singly or in combination. These three parts are the integrated thermoelectric device, the infinite stacked thermoelectric device, and the variable doped thermoelectric device.

The integrated thermoelectric device is concerned with the elimination or reduction of both thermal and electrical resistances caused by the mechanical or soldered joint produced when the materials are joined together to form a unit or a stacked assembly.

The invention is that Peltier units, stacked Peltier units, magneto-Peltier units, stacked magneto-Peltier units, stacked Peltier-magneto-Peltier units, or Peltier-Ettingshausen units, may be constructed as a single piece, grown or formed and doped to eliminate both unnecessary thermal and electrical bonds, i.e., grown autogenously.

A typical method of construction shown in FIG. 1 is to start with the growth of a single crystal Ettingshausen unit 10. Upon the base of the Ettingshausen unit is grown or formed a single crystal of aluminum oxide 15 to act as a thermal equalizer, which maintains the entire length of the base at a constant temperature. At either end of the Ettingshausen unit are grown or formed the two legs, i.e., an N-type semiconductor leg and a P-type semiconductor leg 11 of a Peltier unit so that the Ettingshausen unit acts as the conducting strap of the Peltier unit. Careful mating of the carrier concentrations and dopants allows the Peltier unit to operate at maximum efficiency without the usual thermal losses or solder joint connections caused by mounting one unit on the other. Additional Peltier stages are added by growing a metallic transition crystal 12 on the bottom of each leg of a Peltier thermoelectric unit where a transition in material is required and then growing the legs 13 of the lower Peltier thermoelectric unit to the metallic crystal. Electrical connections are metallic crystals 14 grown to the legs of the lower Peltier unit.

Infinitely stacked Peltier assembly embodies the advantage of the stacked unit in allowing greater temperature differentials to be obtained without requiring the assembly of one unit on top of the other with their associated thermal losses.

Figure 2:
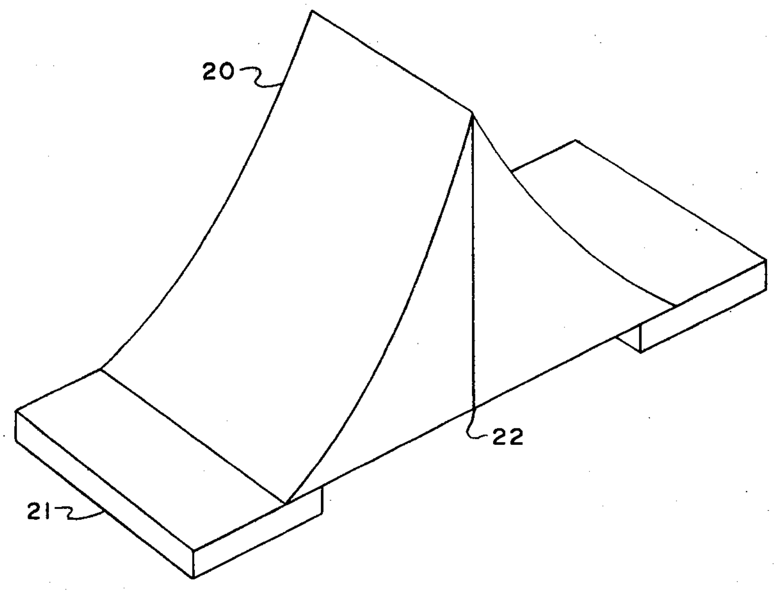

A typical infinitely stacked Peltier unit as shown in FIG. 2 is composed of two opposite "doped" semiconductor or semimetal materials 20 joined at a single plane 22. This plane is the thermal plane. For cooling, the electrical power to the infinitely stacked unit is such that the thermal plane is cooled. The shape of the two semiconductors or semimetal materials is such that the cooling effect produced by the warmer edge of the thermal plane is thermally conducted to the heat sink connections 21 to a lesser extent than to a conducting surface on the surface of the semiconductor or semimetal materials. The electrical and thermal conductivity of the materials forming the infinitely stacked unit determines the shape and outer surface of the unit. The effect of the infinite stack is to produce an edge of the thermal plane colder than can be obtained from a normal shaped unit with parallel oriented thermoelectric materials.

The variably doped thermoelectric assembly utilizes variations in the "dopant" composition or density level over the thermal gradient of the completed unit. This variation in "dopant" composition or density level is adjusted to produce incremental optimum carrier concentrations at the specific operating temperature of each part of the thermoelectric material over the thermal gradient of the operating completed assembly.

This invention is used effectively in parts or combined to produce significant advancement in the efficiency or capacity of the thermoelectric device.

Particular embodiments of the invention have been shown wherein the invention has been applied to various specific devices, utilizing specific modifications. It will, of course, be understood that it is not wished to be limited to the discussed embodiments, or applications, since modifications may be made. It is contemplated in the appended claims to cover any such modifications as fall within the true spirit and scope of the invention.

I claim:

1. An integral Ettingshausen-Peltier semiconductor thermoelectric device consisting essentially of an Ettingshausen unit consisting essentially of a shaped semiconductor single crystal having a base, a Peltier thermoelectric device consisting essentially of an N-type semiconductor leg and a P-type semiconductor leg, said legs being grown directly and autogenously on opposite ends of said base, said single crystal forming the sole electrical connection between said legs.

References Cited

UNITED STATES PATENTS

| | | | |
|---|---|---|---|
| 2,278,744 | 4/1942 | Sparrow et al. | 136—201 |
| 2,588,254 | 3/1952 | Lark-Horovitz et al. | 136—201 |
| 3,071,495 | 1/1963 | Hanlen | 136—240 |
| 3,090,206 | 5/1963 | Anders | 136—225 |
| 3,124,936 | 3/1964 | Melehy | 136—203 |
| 3,224,206 | 12/1965 | Sizelove | 136—203 |
| 3,289,422 | 12/1966 | Fisher | 62—3 |
| 3,319,457 | 5/1967 | Leone | 62—3 |
| 3,355,666 | 11/1967 | Vought et al. | 62—3 |
| 3,359,139 | 12/1967 | Lindenblad | 136—205 |
| 3,392,061 | 7/1968 | Schreiner et al. | 136—237 |

FOREIGN PATENTS

| | | | |
|---|---|---|---|
| 967,888 | 8/1964 | Great Britain | 136—201X |

OTHER REFERENCES

German Auslegeschrift 1, 163, 415; February 1964; Voigt; (136-203) 1 pg. dwg; 4 pp. Spec.

Madigan: Solid State Electronics, vol. 7, pp. 643-654 (1964).

WINSTON A. DOUGLAS, Primary Examiner

ALAN M. BECKELMAN, Assistant Examiner

U.S. Cl. X.R.

62—3; 310—4; 136—205, 237